United States Patent
Thorsell et al.

(10) Patent No.: US 12,347,938 B2
(45) Date of Patent: Jul. 1, 2025

(54) METHOD AND DEVICE FOR CONTROLLING THE OUTPUT EFFICIENCY OF A PLURALITY OF AMPLIFIERS

(71) Applicant: SAAB AB, Linköping (SE)

(72) Inventors: Mattias Thorsell, Varberg (SE); Anders Höök, Hindås (SE)

(73) Assignee: SAAB AB, Linkoping (SE)

( * ) Notice: Subject to any disclaimer, the term of this patent is extended or adjusted under 35 U.S.C. 154(b) by 0 days.

(21) Appl. No.: 18/263,954

(22) PCT Filed: Feb. 11, 2022

(86) PCT No.: PCT/SE2022/050145
§ 371 (c)(1),
(2) Date: Aug. 2, 2023

(87) PCT Pub. No.: WO2022/173357
PCT Pub. Date: Aug. 18, 2022

(65) Prior Publication Data
US 2024/0047871 A1 Feb. 8, 2024

(30) Foreign Application Priority Data
Feb. 11, 2021 (SE) ................... 2100022-9

(51) Int. Cl.
*H01Q 3/26* (2006.01)
*H03F 1/02* (2006.01)
(Continued)

(52) U.S. Cl.
CPC ........... *H01Q 3/267* (2013.01); *H03F 1/0272* (2013.01); *H03G 3/3042* (2013.01); *H04B 1/0458* (2013.01); *H04B 2001/045* (2013.01)

(58) Field of Classification Search
CPC .... H01Q 3/267; H03G 3/3042; H04B 1/0458; H04B 2001/045; H03F 1/0266; H03F 1/0272
See application file for complete search history.

(56) References Cited

U.S. PATENT DOCUMENTS 7,043,213 B2 5/2006 Robinson et al.
9,425,744 B2 8/2016 Yang et al.
(Continued)

FOREIGN PATENT DOCUMENTS

CN 112119598 A 12/2020
EP 2709275 A1 3/2014
(Continued)

OTHER PUBLICATIONS

R.G. Lyons, Understanding Digital Signal Processing, Third Edition, Pearson Education, Inc., p. 8-9 (Year: 2011).*
(Continued)

*Primary Examiner* — William Kelleher
*Assistant Examiner* — Fred H Mull
(74) *Attorney, Agent, or Firm* — Alston & Bird LLP

(57) ABSTRACT

The present invention relates to a method (300) for compensating output efficiency of a plurality of amplifiers arranged to operate with an antenna array, where the antennas in the antenna array are electromagnetically coupled to each other, for providing a desired functionality of the antenna array, the method (300) comprising the steps of obtaining (301) input signal characteristics for each amplifier; determining (302) suitable compensating control parameters for each amplifier based on at least one of the input signal characteristics of each antenna and pre-determined coupling factors between antennas; outputting (303)
(Continued)

efficiency control signals for adjusting at least one amplifier control parameter relating to output efficiency of each antenna.

6 Claims, 5 Drawing Sheets

(51) Int. Cl.
*H03G 3/30* (2006.01)
*H04B 1/04* (2006.01)

(56) References Cited

U.S. PATENT DOCUMENTS

| | | | |
|---|---|---|---|
| 10,158,328 B2 | 12/2018 | Nobbe et al. | |
| 2002/0171583 A1* | 11/2002 | Purdy | H01Q 3/267 342/368 |
| 2014/0192923 A1* | 7/2014 | Matsuo | H01Q 3/267 375/296 |
| 2014/0248843 A1 | 9/2014 | Johansson et al. | |
| 2017/0346575 A1 | 11/2017 | Tang et al. | |
| 2018/0115064 A1 | 4/2018 | Safavi-Naeini et al. | |
| 2019/0089070 A1 | 3/2019 | Zihir et al. | |
| 2020/0403649 A1 | 12/2020 | Alexanderson et al. | |
| 2021/0351799 A1 | 11/2021 | Nast et al. | |

FOREIGN PATENT DOCUMENTS

| | | | | |
|---|---|---|---|---|
| EP | 3267579 A1 | | 1/2018 | |
| GB | 2334625 A | * | 8/1999 | H01Q 3/267 |
| WO | WO-03081768 A2 | * | 10/2003 | H03F 1/0266 |
| WO | WO 2010/025778 A | | 3/2010 | |
| WO | WO 2013/050085 A | | 4/2013 | |
| WO | WO 2019/223865 A | | 11/2019 | |
| WO | WO-2021094696 A1 | * | 5/2021 | H01Q 1/246 |

OTHER PUBLICATIONS

International Preliminary Examining Authority, International Preliminary Report on Patentability, Chapter II, received for International Application No. PCT/SE2022/050145, dated Feb. 13, 2023, 13 pages, Swedish Patent and Registration Office, Sweden.
International Searching Authority, International Search Report and Written Opinion received for International Application No. PCT/SE2022/050145, dated Apr. 20, 2022, 12 pages, Swedish Patent and Registration Office, Sweden.
Extended European Search Report for European Application No. 22753068, dated Dec. 13, 2024, 9 pages.

* cited by examiner

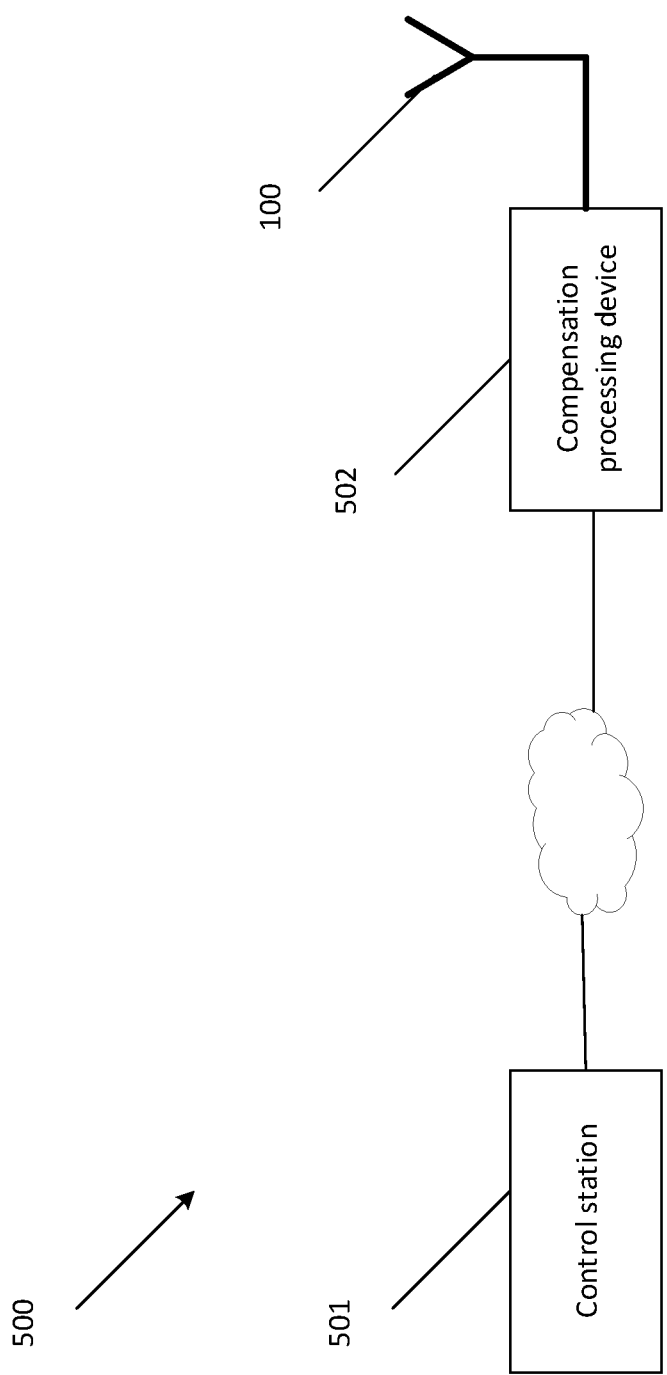

METHOD AND DEVICE FOR CONTROLLING THE OUTPUT EFFICIENCY OF A PLURALITY OF AMPLIFIERS

CROSS-REFERENCE TO RELATED APPLICATIONS

This application is a National Stage Application, filed under 35 U.S.C. § 371, of International Application No. PCT/SE2022/050145, filed Feb. 11, 2022, which international application claims priority to and the benefit of Swedish Application No. 2100022-9, filed Feb. 11, 2021; the contents of both of which are hereby incorporated by reference in their entirety.

TECHNICAL FIELD

The present disclosure relates a method and a processing device for controlling/improving output efficiency of a plurality of amplifiers in an antenna array.

BACKGROUND

An antenna array comprise a number of antennas that work together to perform an operation as a single antenna both as transmitter and receiver. A controlling device, for instance a transceiver or separate transmitter and receiver devices, control the signals to each antenna in order to provide a suitable functionality of the antenna array. Antenna arrays are often used for controlling the radiated power in certain directions and/or for controlling the receiving directivity of the antenna array. The individual antennas combine and superimpose to enhance output/input in different lobes of direction. Antenna arrays where the radiation pattern is controlled are often called phased arrays and come in different forms and usages: passive phased arrays, active electronically scanned array (AESA), hybrid beam forming phased array and digital beam forming (DBF) array.

Generally, antenna arrays find applicability in wireless telecom applications, radar applications, wireless networks, broadcasting, and other communications applications.

Antennas in antenna arrays have a tendency to couple electromagnetically to each other and disturb the general operation of the antenna array, i.e. each antenna element disturb the neighbouring antenna elements and interact in a manner decreasing the output or input efficiency. For instance performance of the amplifiers driving the antennas is load dependent and load is set by scan angle. There exists different methods of compensating for performance changes but these are relatively complex and costly to implement, especially if a small form factor is of desire.

There is room in the present art to explore the domain of providing processing devices and a methods for dynamically compensating performance changes due to varying loads in antenna elements of an antenna array. There is specifically a lack in the present art of how to dynamically control the output efficiency of amplifiers in antenna elements in an antenna array. Accordingly, there is room for improvements in the art to provide means to improve antenna arrays in the present art so to dynamically control the output efficiency of each amplifier coupled to an antenna element in an antenna array.

Even though some currently known solutions work well in some situations it would be desirable to provide a method and a processing device that fulfils requirements related to controlling the output efficiency of an amplifier coupled to antenna elements in an antenna array.

SUMMARY

It is therefore an object of the present disclosure to provide a method and a processing device to mitigate, alleviate or eliminate one or more of the above-identified deficiencies and disadvantages.

The present disclosure is at least partly based on the insight that by providing a method and a processing device for controlling the efficiency of a plurality of amplifiers arranged to operate with the antenna elements of an antenna array, the performance of the antenna array will be less affected by varying loads.

In accordance with the disclosure there is provided a method and a processing device according to the broadest pending claims.

The present disclosure discloses a method for compensating/controlling output efficiency (and/or output power) of a plurality of amplifiers arranged to operate with an antenna array, where the antennas in the antenna array are electromagnetically coupled to each other, for providing a desired functionality of the antenna array, the method comprising the steps of:
  obtaining input signal characteristics for each amplifier;
  determining suitable compensating control parameters for each amplifier based on at least one of the input signal characteristics of each antenna and pre-determined coupling factors between antennas, wherein based on the determined compensating control parameters:
  outputting efficiency control signals for adjusting at least one amplifier control parameter relating to output efficiency of each antenna.

The steps in the method may be performed iteratively during an operating time period of the antenna array. Accordingly, the method provides the benefit of allowing the antenna array to handle load changes/interference such as due to scan angle dependency and coupling between elements. Moreover, the present disclosure prevents efficiency drops when the scan angle of the antenna array is changed. In other words, the term "controlling" may refer to increasing and/or maintaining output efficiency.

The method provides the benefit of allowing for dynamic control of the output efficiency (and/or power) for varying loads.

The pre-determined coupling factors may provide a characterization of a coupling between adjacent antennas of said plurality of antennas. Further, said characterization may be re-calculated at intermittent time intervals. The pre-determined coupling factors between antennas may be dependent on at least one dynamic parameter.

Further, the method may comprise the step of, when sensing changes to a dynamic parameter: re-calculating, by said pre-determined coupling factor, a characterization of said coupling between adjacent antennas of said plurality of antennas. The at least one amplifier may be arranged to, based on the determined compensating amplifier control parameter, control/adjust bias reconfiguration of each amplifier. Further, the at least one amplifier is arranged to, based on the determined compensating control parameter, control/adjust bias feed of each amplifier. The outputted control signal may be arranged to control output impedance of each amplifier, based on the determined compensating control parameter.

The term bias feed refers to bias current and/or bias voltage.

The input signal characteristics are at least one of phase and amplitude for driving each antenna. By obtaining the input signal characteristics, a current state of the antenna array may be determined so to identify the efficiency/performance relative to the requirements.

The desired functionality is at least one of beam forming, lobe forming and multi beam generation. Thus, the method may allow for a multi-mode operation of the antenna e.g. for radar and communication purposes.

The plurality of amplifiers may be configured to adjust the at least one amplifier control parameter based on a phase output parameter of the antenna elements of the antenna array. Accordingly, based on a determined phase, the compensation may be performed.

The antenna array may be at least one of a linear array or a two dimensional matrix array.

There is further disclosed a processing device for controlling the output efficiency of a plurality of amplifiers arranged to operate with an antenna array, where the antennas in the antenna array are electromagnetically coupled to each other, for obtaining a desired functionality of the antenna array, the processing device comprising a processor;
a memory unit;
an input interface;
at least one output interface;
wherein the processor is arranged to execute instruction sets stored in the memory unit for:
providing input signal characteristics for each amplifier;
determining compensating control parameters for each amplifier based on at least one of the input signal characteristics of each antenna and pre-determined coupling factors between antennas, wherein based on the determined compensating control parameters:
outputting efficiency control signals for adjusting at least one amplifier control parameter relating to output efficiency of each antenna.

BRIEF DESCRIPTION OF THE DRAWINGS

In the following the invention will be described in a non-limiting way and in more detail with reference to exemplary embodiments illustrated in the enclosed drawings, in which:

FIG. 5 is a schematic block diagram illustrating an embodiment of a control system.

DETAILED DESCRIPTION

Figure 1:
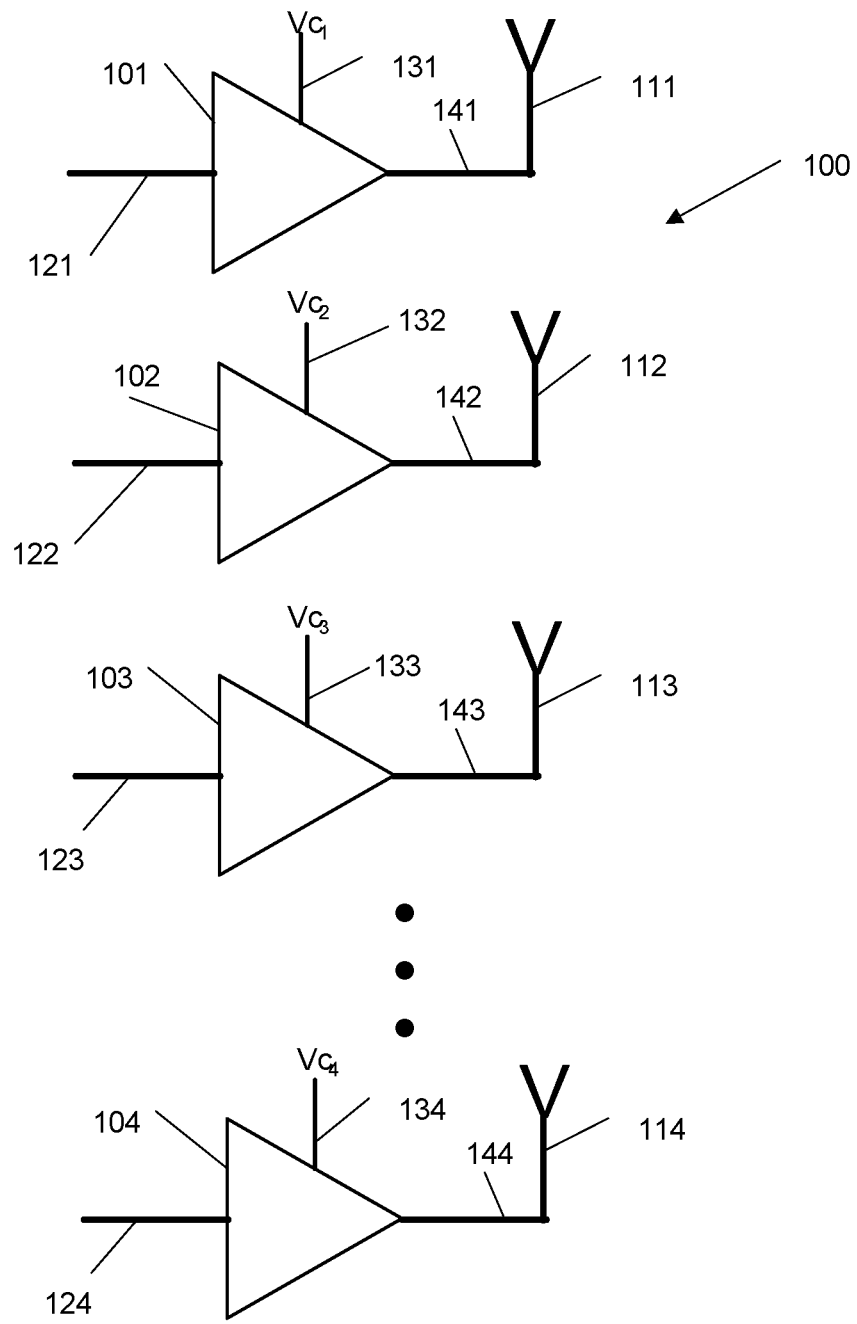
FIG. 1 is a schematic block diagram an antenna array with bias control.

In the following detailed description, some embodiments of the present disclosure will be described. However, it is to be understood that features of the different embodiments are exchangeable between the embodiments and may be combined in different ways, unless anything else is specifically indicated. Even though in the following description, numerous specific details are set forth to provide a more thorough understanding of the provided device and method, it will be apparent to one skilled in the art that the device and method may be realized without these details. In other instances, well known constructions or functions are not described in detail, so as not to obscure the present disclosure.

In the following description of example embodiments, the same reference numerals denote the same or similar components.

In FIG. 1 reference numeral 100 generally denotes an antenna array arrangement with a plurality of antenna elements 111, 112, 113, and 114 each driven by a respective amplifier 101, 102, 103, and 104. The number of antenna elements is depending on the desired functionality of the antenna array 100 and type of application, but can range from 2 to several hundred antennas in different constellations, e.g. as line arrays or matrix arrays. In FIG. 1 four amplifiers 101, 102, 103, 104 and antennas 111, 112, 113, 114 are shown as an example. Furthermore, the example in FIG. 1 is a transmitter setup, i.e. the amplifiers 101, 102, 103, 104 are arranged to provide transmitting power as output to each antenna 111, 112, 113, 114; similarly, a receiver may be setup with a number of receiving antennas each connected to an amplifier. Each amplifier has an input 121, 122, 123, and 124, receiving signals from a processing device 200 (see FIG. 2) controlling the functionality of the antenna array 100 and each amplifier 101, 102, 103, 104 further comprises an output 141, 142, 143, 144 connected to respective antenna outputting signals to be transmitted via the antennas 111, 112, 113, 114. The processing device 200 will be described in more detail later in this document (and shown in FIG. 2). Each amplifier also comprise a bias voltage input 131, 132, 133, and 134 respectively.

The term "output efficiency" is a measure of how efficient the amplifier convert an applied DC power to a desired radio-frequency (RF) power to be transmitted by the antenna.

The output efficiency is dependent upon an output reflection coefficient, $t\Gamma(\phi)$ which defines a ratio between incident power and transmitted power, or the output load impedance presented to the amplifier. Incident power in this ratio is the coupled (scan angle dependent) signal from other antenna elements (e.g. load variations) in the antenna array. Transmitted power in this ratio is the outgoing traveling voltage wave of an amplifier. Thus, an object of the disclosure is to minimize negative effects on the desired transmitted power by handling the incident power (i.e. load variations). This may lead to a controlled output efficiency.

The amplifiers 101, 102, 103, 104 in FIG. 1 may be referred to as phase tracking amplifiers (PTA), where an amplifier control parameter (e.g. bias voltage/current or impedance) for each amplifier 101, 102, 103, 104 in the antenna array 111, 112, 113, 114 is controlled by a processing device 200 (see FIG. 2); for instance the setup may be arranged to control bias and/or impedance reconfiguration of each amplifier 101, 102, 103, 104. The antenna array 100 is at least one of a linear array or a two dimensional matrix array. It should be noted that the transceiver antenna elements may also be arranged with separate transmitter antenna(s) and separate receiver antenna(s). Each bias controlled amplifier 101, 102, 103, 104 is connected to an input 121, 122, 123, and 124, wherein, each input signal characteristics are at least one of phase and amplitude for performing the function of the antenna array, e.g. for transmitting a signal in a specific direction through beam forming. Alternatively/additionally, the internal impedance of the amplifier 101, 102, 103, 104 may be reconfigured in order to adjust/compensate the output (or input) efficiency of the amplifier; this will be discussed later in this disclosure in relation to FIG. 4.

Some functionality of the antenna array may be for instance beam forming, multi beam generation. It should be noted that the examples in the present disclosure are mainly focused on transmission through the antenna array 100, but the skilled person should understand that the same functionality may be used for controlled signal reception through the antenna array.

Figure 2:
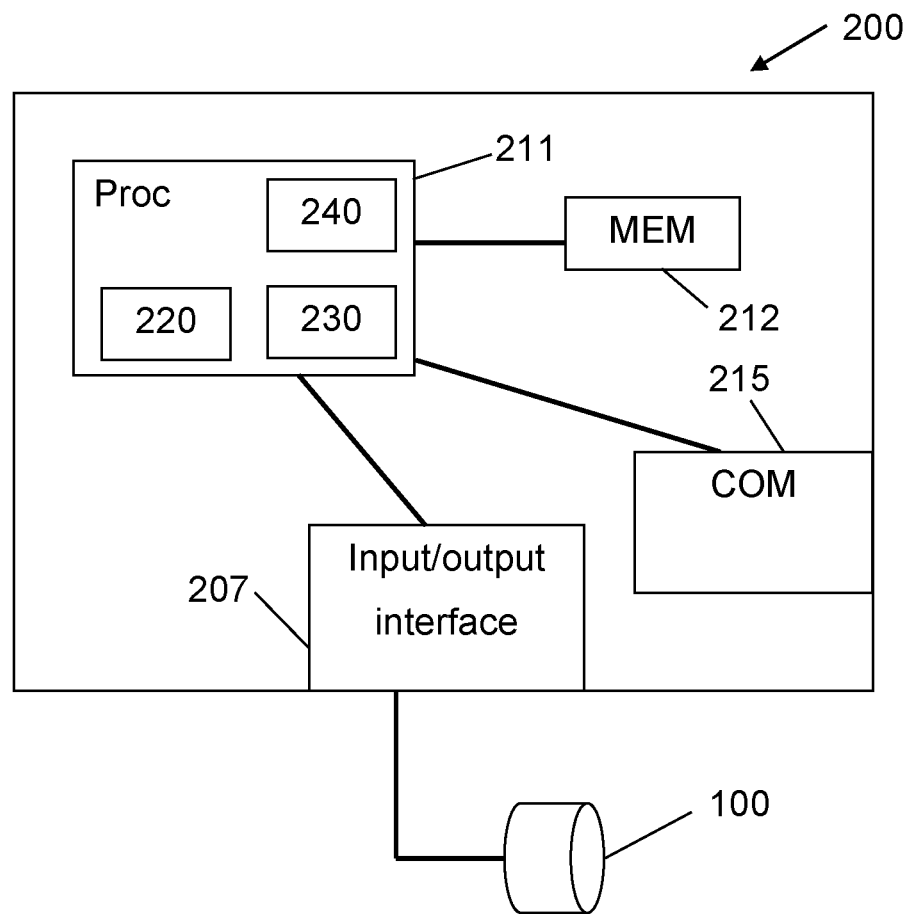
FIG. 2 is a schematic block diagram illustrating a processing device.

FIG. 2, illustrates a processing device 200 for controlling output and the output efficiency of the plurality of amplifiers 101, 102, 103, 104 arranged to operate with the antenna array 100. The processing device 200 may be configured to perform any of the steps in the method 300 (see FIG. 3).

The processing device 200 comprises a processor 211, a memory unit 212, an input/output interface 207 and optionally at least one communication interface 215. In FIG. 2 the input and output interface 207 are integrated, however they may be separate modules in some embodiments of the present disclosure. The input/output interface is connected to the antenna array 100. The processor 211 is arranged to execute instruction sets stored in the memory unit 212 for providing input signal characteristics for each amplifier 101, 102, 103, 104 in the antenna array 100, for instance for transmitting a signal in a specific direction through beam forming. In some embodiments, the input signal characteristics is the phase output of an antenna element, accordingly, the processor 211 may determined the phase output of each antenna elements. Furthermore, the processor 211 determines suitable compensating control parameters for each individual amplifier 101, 102, 103, 104 based on (pre-determined) coupling factors, directivity of transmission/receiving of the antenna array, and other parameters. The antenna coupling factors may be based on the phase output. The processor 211 is further configured to output control signals for adjusting at least one amplifier control parameter relating to output efficiency of each antenna element 111, 112, 113, 114. The coupling factors may be pre-determined by calculating the coupling factors using known data about the antennas, amplifiers, and other components of the circuitry, or measure characteristics of the antenna array e.g. in a calibration mechanism. This measurement may be done for instance in a reference measurement at a time of design of the circuitry, installation of the antenna array system, or intermittently at suitable time intervals during use for compensating for changes over time of the different parts, such as electronics, antenna wear, or dirt on the antennas, or more regularly for compensating for other more rapidly changing parameters, such as temperature or humidity changes.

Specifically, the pre-determined coupling factors between antennas (or more specifically, between the amplifiers 101, 102, 103, 104 of the antennas) may refer to respective models, each providing a characterization of a coupling between adjacent antennas. Thus, coupling factors may be indicative of the amount of energy leaking from a first antenna 111 to e.g. a second adjacent antenna 112 (in other words: indicative of a load/output/properties from an antenna 111-114 affecting an adjacent antenna 111-114) which is characterized e.g. in the form of a factor/multiplier/function utilized in the step of determining 302 compensating control parameters, so to allow compensation of said leakage. Thus, an additional load added to an amplifier 102 of said second antenna 112 leaking from said amplifier 101 of said first antenna 111 can be compensated by utilizing said coupling factors. The pre-determined coupling factor between antennas 111-114 may incorporate dynamic parameters such as e.g. temperature or humidity—thus, at specific temperature/humidity changes the pre-determined coupling factor may, e.g. by a look-up table being a part of/provided by said pre-determined coupling factor, be re-calculated, providing a different characterization of said coupling between antennas 111-114.

In other words, the coupling factors may be pre-determined, however, said pre-determined coupling factors may incorporate a built-in model (e.g. a LTU) so that the coupling between antennas 111-114 can be (re-)characterized upon changes to dynamic parameters affecting the coupling thereof.

The coupling factors between antennas 111-114 may refer to coupling factors between the amplifiers 101-104 of said antennas i.e. said characterization may be a coupling between adjacent amplifiers 101-104, thus the amount of energy/output/load leaking from a first amplifier output (of a first antenna) to a second amplifier output (of a second antenna) may, by the pre-determined coupling factors, be characterized and taken into account/utilized in the step of determining compensating parameters 302.

Accordingly, the pre-determined coupling factors may provide a characterization of a coupling between adjacent antennas (i.e. leakage of energy from an antenna to an adjacent antenna and vice versa) of said plurality of antennas in said array 100. Said characterization may be re-calculated at intermittent time intervals.

Further, the pre-determined coupling factors between antennas 111-114 may be dependent on at least one dynamic parameter, preferably, humidity or temperature of the environment which said amplifier/antenna is operating within. Thus, said characterization may change based on changes of dynamic parameters.

Furthermore, the method 300 may further comprise the step of, when sensing changes to a dynamic parameter re-calculating 304, by said pre-determined coupling factor, a characterization of said coupling between adjacent antennas of said plurality of antennas. The changes may be sensed by different types of sensor, e.g. humidity sensor, temperature sensor etc. The recalculating step 304 may be performed when a change exceeds a specific threshold. The memory unit 212 may comprise any form of volatile or non-volatile computer readable memory including, without limitation, persistent storage, solid-state memory, remotely mounted memory, magnetic media, optical media, random access memory (RAM), read-only memory (ROM), mass storage media (for example, a hard disk), removable storage media (for example, a flash drive, a Compact Disk (CD) or a Digital Video Disk (DVD)), and/or any other volatile or non-volatile, non-transitory device readable and/or computer-executable memory devices that store information, data, and/or instructions that may be used.

The processor 211 may comprise a control module 220 for determining input signal characteristics for each amplifier/antenna depending on desired functionality. The control module 220 is arranged to run instruction sets in the control module 220 for operating this functionality. This can be done for instance by calculating/determining parameters for driving the individual antennas 111, 112, 113, 114 in the antenna array 100 for providing the desired functionality, e.g. transmitting a signal into a desired direction. Furthermore, the processor 211 comprise a compensation module 230 for determining suitable compensating control parameters (i.e. a desired bias and/or impedance for a specific performance of the antenna with regards to loads/interference and input signal characteristics) controlling the operation of each amplifier 101, 102, 103, 104 according to coupling effects between the individual antennas 111, 112, 113, 114 in the antenna array 100. The processor 211 further comprise an output module 240 that may transmit control signals to each amplifier 101, 102, 103, 104 for adjusting at least one amplifier control parameter based on the determined compensation control parameters, i.e. for controlling the output efficiency of the antenna array 100.

The processor 211 may be any suitable type such as a microprocessor, digital signal processor (DSP), ASIC (Application Specific Integrated Circuit), FPGA (Field Programmable Gate Array), or a combination of these, or other similar processing means arranged to run instruction sets. The computer readable storage medium may be of non-volatile and/or volatile type and transitory or non-transitory type; for instance RAM, EEPROM, flash disk and so on. It should be noted that the compensation module 230 may be provided in a separate device different from the processing device 200, i.e. one separate device for operation of the desired functionality of the antenna array 100 and one separate processing device 200 for determining compensating control parameters for optimizing the output efficiency of the antenna array 100. Such a separate processing device 211 for determining compensating control parameters for optimizing the output efficiency of the antenna array 100 may comprise similar units and components as the processing device 200 as described in relation to FIG. 2.

The communication interface 215 may be of any suitable type such as Ethernet, I2C bus, RS232, CAN bus, wireless communication technology such as IEEE 802.11 based or cellular based technologies, or other communication protocols depending on application. The communication interface 215 may be used for receiving information to transmit, control parameters to determine the functionality of the antenna array 100, software updates, and instruction messages for determining the status of the device, and so on. Furthermore, the communication interface 215 may be used to communicate results, messages, status reports and similar to external devices and control units such as a control station or servers via a network, e.g. via public or private networks. The networks may be local or wide area networks depending on the use of antenna array. For instance in a radar station such as a mobile radar station the network can be located in a vehicle. In case of a radar station for an airport, the network can be local for the airport or a wide area network for a remotely controlled airport. Furthermore, the network may be utilized as a private network or a public network such as the Internet, in a cloud solution.

The processing device 200 may be arranged to execute instruction sets of software code for reconfiguring/controlling one or more amplifier 101, 102, 103, 104 for output efficiency of each respective antenna 111, 112, 113, 114. The reconfiguration can be performed continuously at regular intervals for efficient reconfiguration of the amplifiers 101, 102, 103 or in relation to a calibration event so to obtain a dynamic adjustment of the output efficiency of each antenna element 111, 112, 113, 114 in the antenna array 100. The reconfiguration may be reconfiguration/adjustment/control of bias and/or impedance, so to dynamically reconfigure the output efficiency of each antenna element 111, 112, 113, 114 so to compensate e.g. interference or varying loads or any other disturbances to the performance of each antenna element 111, 112, 113, 114. The varying load may be due to e.g. electro-magnetic coupling from other antenna elements 111, 112, 113, 114 in the antenna array 100.

The control signals are determined by a number of steps 301-305 in a method 300 for compensating output efficiency of a plurality of amplifiers 101, 102, 103, 104 arranged to operate with an antenna array 100:

The antennas 111, 112, 113, 114 in the antenna array 100 are electromagnetically coupled to each other and interact with each other to provide a combined functionality of the antenna array 100.

Figure 3:
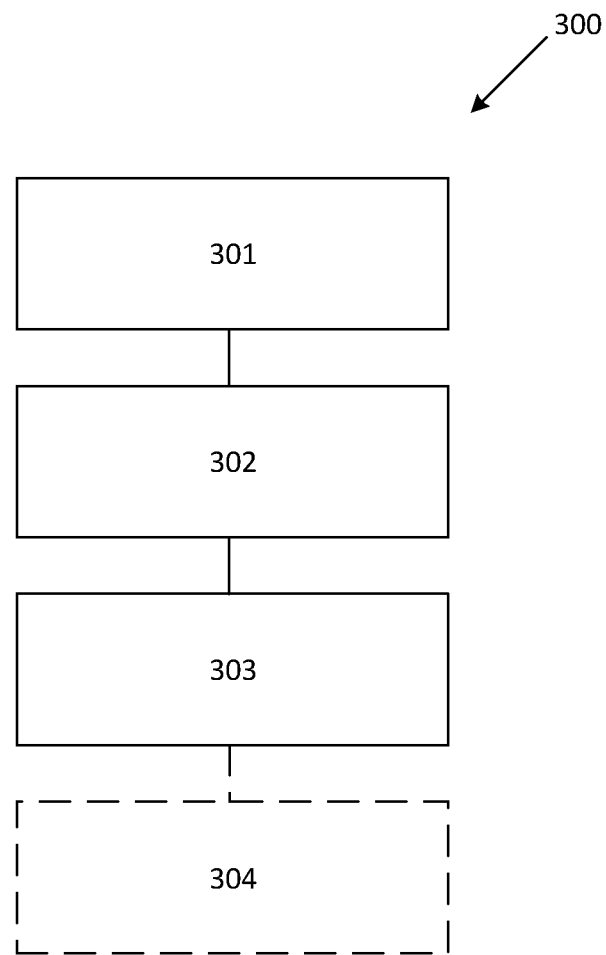
FIG. 3 is a schematic block diagram illustrating a method.

The method 300 as shown in FIG. 3 illustrates three steps 301-303. In the first step 301, input signal characteristics for each amplifier is obtained or determined depending on functionality of the antenna array. Each input signal characteristics are at least one of phase and amplitude. These input signals are depending on what functionality is desired of the antenna array, for instance as an active electronically scanned array (AESA) radar application where the transmitting (and receiving) main lobe/direction is electronically controlled and the output power or input sensitivity of the antenna array is controlled accordingly.

In the second step 302, suitable compensating control parameters for each amplifier are determined based on at least one of the input signal characteristics of each antenna and coupling factors, preferably both. The compensating control parameters may be stored in the memory unit 212 as a look-up-table (LUT), model or some other type of database. The control parameters may be at least one of a bias (voltage/current) control and impedance control parameter associated with a respective amplifier. The compensating control parameters (e.g. bias and/or impedance) are determined so to transmit control signals that reconfigure each amplifier in order to adjust the output efficiency to obtain a better performing antenna array. For example, the compensating control parameters may be determined so that the efficiency control signals are based on said compensating control parameter so to adjust/control/reconfigure at least one amplifier in order to obtain a desired output impedance of an amplifier and/or a desired bias voltage which in turn leads to a better performing antenna array. In other words, the compensating control parameters may be a specific impedance parameter or bias feed parameter to allow for a desired control parameters in an amplifier.

In the third step 303, there is outputted control signals (based on the compensating control parameters) so to adjust at least one amplifier control parameter relating to the output efficiency of each antenna. This type of continuous/dynamically controlled bias and/or impedance reconfiguration provides an efficient antenna element output so to optimize performance. Each of the plurality of amplifiers may be configured to adjust/reconfigure at least one amplifier control parameter e.g. the bias feed) based on a phase output parameter of the antenna elements of the antenna array. Thus, the input signal characteristics comprise the phase output of each antenna element of the antenna array. In other words, each amplifier may be fed with a signal that has a certain amplitude and phase. The combination of amplitude and phase is individual for each amplifier, and the purpose may be to obtain a certain scan angle of the antenna beam. By obtaining the intended scan angle, the compensating control parameter may be determined, based on the compensating control parameter, control signals may be outputted to reconfigure/adjust bias and/or impedance for each amplifier to maximize efficiency.

In other words, in the third step of the method 303, the control signals are outputted so to reconfigure bias and/or impedance of each antenna element.

It should be understood that the particular order in which the operations in FIG. 3 have been described is merely exemplary and is not intended to indicate that the described order is the only order in which the operations could be performed.

Figure 4:
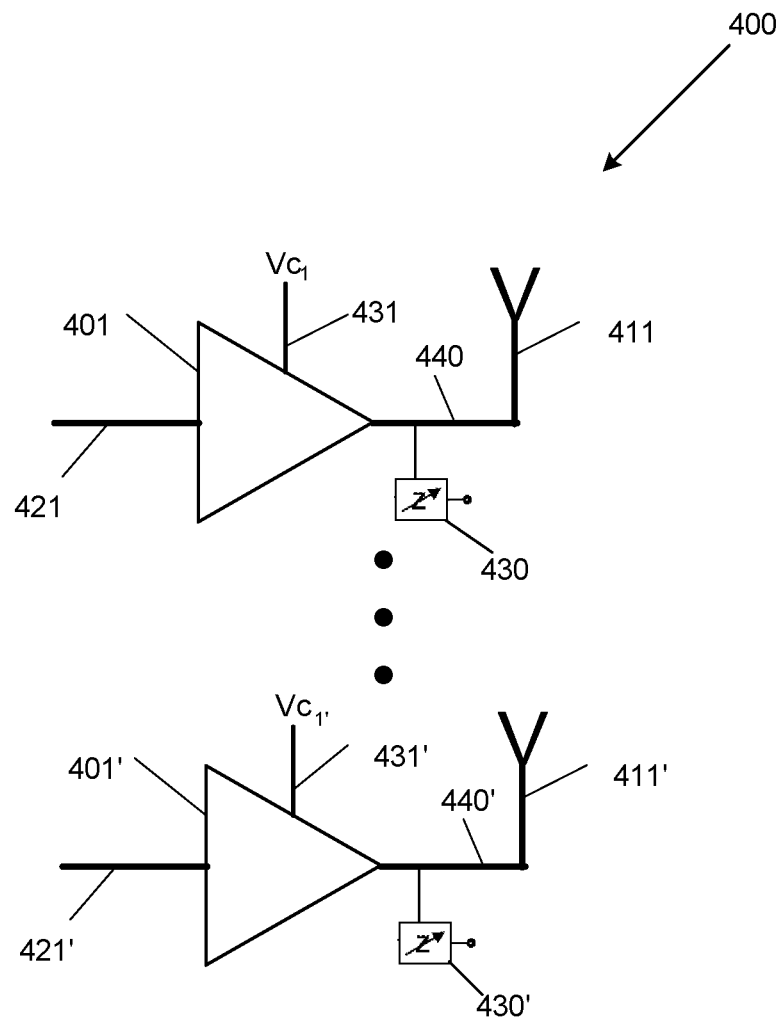
FIG. 4 is a schematic block diagram illustrating an antenna array with impedance control.

As discussed previously, the amplifier efficiency may be controlled by either controlling the bias voltage/current or controlling an output impedance of the amplifier. In FIG. 4, an antenna array 400 in accordance with FIG. 1 is shown with focus on the impedance control, where each antenna 411, 411' comprises an amplifier 401, 401', wherein for each amplifier 401, 401' the impedance is controlled to provide a suitable output efficiency. This is done by using a variable control impedance 430, 430' reconfiguring each amplifier output. Each amplifier further comprise an input 421, 421' and an output 440, 440' driving antennas 411, 411'. As shown in FIG. 4, the control impedance 430, 430' is associated with the amplifier output 440, 440'. In FIG. 4, only two amplifier elements 401, 401' are shown but a plurality of similar elements as shown in the array of amplifier elements 101, 102, 103, and 104 in FIG. 1 may be provided. Also in FIG. 4 an example of transmitting setup is shown, but it should be understood that similarly a receiving setup may be provided.

It should be noted that the output efficiency may be controlled by adjusting both impedance and bias voltage/current. Thus, the compensating control parameters may determine to control at least one of the bias voltage/current and the impedance based on which control parameter enhances the efficiency the most.

This type of arrangement may be used for a Phase tracking amplifier (PTA) where the amplifier control parameters (e.g. impedance and bias feed) are determined so to allow for reconfiguration of each amplifier. The antenna array may be at least one of a linear array or a two dimensional matrix array. It should be noted that the transceiver antenna elements may also be arranged with separate transmitter antenna(s) and separate receiver antenna(s). Each amplifier 401, 401' may be connected to an input 421, 421', wherein, each input signal characteristics are at least one of phase and amplitude. In yet another embodiment, each amplifier may be controlled/reconfigured by changing the bias 431, 431' and impedance 430, 430' to provide efficient antenna element 411 output. In one application, the arrangement's desired functionality is at least one of beam forming and multi beam generation in for instance a telecom application.

It should be noted that in a control system 500 a separate control circuitry may be used for controlling the operation of the antenna array. Such a control station 500 is illustrated in FIG. 5. As seen in FIG. 5, a radar control station 501 may be arranged communicatively connected to a compensation processing device 502 controlling the amplifier efficiency. The radar control station 501 may be located at one geographical position and the compensation processing device at another position, e.g. close to the antenna array 100. The compensation processing device may be similar to the processing device 200 shown in FIG. 2.

Table 1 below discloses a simulation the present disclosure. Table 1 shows the performance of the method and processing device herein as disclosed herein. The purpose of the simulation is to further describe the disclosure as presented herein accompanied with advantages thereof. It should be noted that the simulations are based on embodiments for a disclosing purpose, however it is not limited to said embodiments and may be varied within the present disclosure.

TABLE 1

| | Operation | $V_{ds}$ (V) | $R_L$ (Ω) | $P_{out}$ (W) | η (%) |
|---|---|---|---|---|---|
| 1 | Normal | 30 | 65 | 6.7 | 48 |
| 2 | Low impedance | 30 | 30 | 3.2 | 23 |
| 3 | Compensated | 15 | 30 | 3.1 | 44 |

Table 1 shows that the processing device may provide the benefit of increasing the output efficiency of the amplifiers in accordance with the present disclosure.

Table 1 shows the operation modes "normal", "low impedance" and "compensated".

Normal operation mode refers to the normal operation (i.e. no beam steering) of an antenna array. The second row, shows a low impedance operation where scan angle of the antenna array is chosen/changed so that the impedance, $R_L$ seen by the amplifier is lower (30 ohm rather than 65 ohm as seen in "normal operation").

The third row shows the compensated operation which is where an amplifier control parameter, $V_{ds}$ (i.e bias voltage, 131, . . . , 134 in FIG. 1) is adjusted in accordance with an embodiment of the present disclosure. Accordingly, it is shown that there is no impact on output (transmitted) power ($P_{out}$) of an antenna element, however output efficiency, η is almost doubled. In other words, Table 1 shows that the disclosure provides the benefit of increasing/controlling output efficiency by adjusting bias feed. In other words, efficiency drops resulting from e.g. scan angle changes or other load changes may be prevented by the method and processing device of the present disclosure.

It should be noted that the word "comprising" does not exclude the presence of other elements or steps than those listed and the words "a" or "an" preceding an element do not exclude the presence of a plurality of such elements. It should further be noted that any reference signs do not limit the scope of the claims, that the invention may be at least in part implemented by means of both hardware and software, and that several "means" or "units" may be represented by the same item of hardware.

The above mentioned and described embodiments are only given as examples and should not be limiting to the present disclosure. Other solutions, uses, objectives, and functions within the scope of the disclosure as claimed in the below described patent embodiments should be apparent for the person skilled in the art.

The invention claimed is:
1. A method (300) for controlling output efficiency of a plurality of amplifiers arranged to operate with an antenna array comprising a plurality of antennas, where the plurality of antennas in the antenna array are electromagnetically coupled to each other, for providing a desired functionality of the antenna array, the method comprising the steps of:
   obtaining (301) input signal characteristics of each amplifier, the input signal characteristics are at least one of phase output of each antenna for driving each antenna of the plurality of antennas in the antenna array, or amplitude output of each antenna for driving each antenna of the plurality of antennas in the antenna array;
   determining (302) compensating control parameters of each amplifier by use of the input signal characteristics of each antenna and pre-determined coupling factors between antennas, wherein said pre-determined coupling factors provides a characterization of a coupling between adjacent antennas of said plurality of antennas, wherein the compensating control parameters are at least one of bias feed or output impedance; and based on the determined compensating control parameters, outputting (303) control signals for adjusting at least one amplifier control parameter relating to said output efficiency of each amplifier, wherein;

the recited method steps are performed iteratively during an operating time-period of the antenna array;

the predetermined coupling factors between antennas are dependent on at least one dynamic parameter being at least one of temperature and humidity; and the method (300) further comprises the step of, when sensing a change of said dynamic parameter that exceeds a threshold, re-calculating, by said pre-determined coupling factor, said characterization of said coupling between adjacent antennas of said plurality of antennas.

2. The method (300) according to claim 1, wherein the desired functionality is at least one of beam forming, lobe forming and multi beam generation.

3. The method (300) according to claim 1, wherein the plurality of amplifiers are configured to adjust the at least one amplifier control parameter based on a phase output parameter of the antenna elements of the antenna array.

4. The method (300) according to claim 1, wherein the antenna array is at least one of a linear array or a two-dimensional matrix array.

5. The method (300) according to claim 4, wherein said characterization is re-calculated at intermittent time intervals.

6. A processing device (200) for controlling the output efficiency of a plurality of amplifiers (101, 102, 103, 104) arranged to operate with an antenna array (100) comprising a plurality of antennas, where the plurality of antennas (111, 112, 113, 114) in the antenna array (100) are electromagnetically coupled to each other, for obtaining a desired functionality of the antenna array (100), the processing device (200) comprising:

a processor (211);
a memory unit (212);
an input interface (207);
at least one output interface (207);
wherein the processor (211) is arranged to execute instruction sets stored in the memory unit (212) for:
providing input signal characteristics for each amplifier (101, 102, 103, 104), the input signal characteristics are at least one of phase output of each antenna for driving each antenna of the plurality of antennas in the antenna array, or amplitude output of each antenna for driving each antenna of the plurality of antennas in the antenna array;

determining compensating control parameters for each amplifier (101, 102, 103, 104) based on the input signal characteristics of each antenna and pre-determined coupling factors between antennas (111, 112, 113, 114), wherein said pre-determined coupling factors provides a characterization of a coupling between adjacent antennas of said plurality of antennas, wherein the compensating control parameters are at least one of bias feed or output impedance; and based on the determined compensating control parameters, outputting control signals for adjusting at least one amplifier control parameter relating to said output efficiency of each amplifier (101, 102, 103, 104), wherein:

the processing device is configured to control said output efficiency iteratively during an operating time-period of the antenna array;

the predetermined coupling factors between antennas are dependent on at least one dynamic parameter being at least one of temperature and humidity; and the processor (211) is further configured to, when sensing a change of said dynamic parameter that exceeds a threshold, execute instruction sets stored in the memory unit (212) for re-calculating, by said pre-determined coupling factor, said characterization of said coupling between adjacent antennas of said plurality of antennas.

\* \* \* \* \*

UNITED STATES PATENT AND TRADEMARK OFFICE
CERTIFICATE OF CORRECTION

| | |
|---|---|
| PATENT NO. | : 12,347,938 B2 |
| APPLICATION NO. | : 18/263954 |
| DATED | : July 1, 2025 |
| INVENTOR(S) | : Mattias Thorsell et al. |

Page 1 of 1

It is certified that error appears in the above-identified patent and that said Letters Patent is hereby corrected as shown below:

In the Claims

In Column 11, Line 7, Claim 1, delete "wherein;" and insert -- wherein: --, therefor.

Signed and Sealed this
Twenty-first Day of October, 2025

John A. Squires
*Director of the United States Patent and Trademark Office*